(12) United States Patent
Bruce et al.

(10) Patent No.: US 10,170,361 B2
(45) Date of Patent: Jan. 1, 2019

(54) THIN FILM INTERCONNECTS WITH LARGE GRAINS

(71) Applicant: International Business Machines Corporation, Armonk, NY (US)

(72) Inventors: Robert L Bruce, White Plains, NY (US); Cyril Cabral, Jr., Mahopac, NY (US); Gregory M Fritz, Yorktown Heights, NY (US); Eric A Joseph, White Plains, NY (US); Michael F Lofaro, Danbury, CT (US); Hiroyuki Miyazoe, White Plains, NY (US); Kenneth P Rodbell, Sandy Hook, CT (US); Ghavam G Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 14/289,422

(22) Filed: May 28, 2014

(65) Prior Publication Data

US 2015/0348832 A1 Dec. 3, 2015

(51) Int. Cl.
*H01L 21/768* (2006.01)
*H01L 23/532* (2006.01)
*H01L 23/522* (2006.01)

(52) U.S. Cl.
CPC .. *H01L 21/76885* (2013.01); *H01L 21/76852* (2013.01); *H01L 21/76897* (2013.01); *H01L 23/5226* (2013.01); *H01L 23/53223* (2013.01); *H01L 23/53238* (2013.01); *H01L 23/53252* (2013.01); *H01L 2924/0002* (2013.01)

(58) Field of Classification Search
CPC ................................................ H01L 21/76843
See application file for complete search history.

(56) References Cited

U.S. PATENT DOCUMENTS

| 5,578,166 A | 11/1996 | Hirota |
| 5,691,238 A | 11/1997 | Avanzino et al. |
| 6,444,565 B1 * | 9/2002 | Feild ................... H01L 21/7682 |
| | | 257/E21.581 |

(Continued)

OTHER PUBLICATIONS

Zhang et al., "Surface and grain boundary scattering studied in beveled polycrystalline thin copper films", J. Vac. Sci. Technol. B 22, pp. 1830-1833 (2004).

(Continued)

*Primary Examiner* — Alexander Ghyka
(74) *Attorney, Agent, or Firm* — Kristofer Haggerty (57) ABSTRACT

The present disclosure relates to integrated circuits and to methods of manufacturing interconnects of integrated circuits. For example, an integrated circuit includes a surface of the integrated circuit and an interconnect formed on the surface and comprising a metal. An average grain size of the metal of the interconnect is greater than or equal to at least half of a line width of the interconnect. In another example, a method for manufacturing an interconnect of an integrated circuit includes depositing a layer of a metal onto a surface of the integrated circuit, annealing the metal, patterning a first hard mask for placement over the metal and forming a line of the interconnect and a first via of the interconnect by performing a timed etch of the metal using the first hard mask.

16 Claims, 9 Drawing Sheets

(56) References Cited

U.S. PATENT DOCUMENTS

| | | | |
|---|---|---|---|
| 6,522,008 B2 | 2/2003 | Farrar | |
| 7,124,386 B2 | 10/2006 | Smith et al. | |
| 7,476,971 B2 * | 1/2009 | Iijima | H01L 21/76816 257/211 |
| 7,666,787 B2 | 2/2010 | Ponoth et al. | |
| 7,843,063 B2 | 11/2010 | O'Neal et al. | |
| 8,232,646 B2 | 7/2012 | Bonilla et al. | |
| 8,987,859 B2 * | 3/2015 | Plekhanov | H01L 21/768 257/508 |
| 2003/0098292 A1 | 5/2003 | Kulkarni | |
| 2007/0181883 A1 * | 8/2007 | Ando | H01L 21/76837 257/68 |

OTHER PUBLICATIONS

Anonymous, "Method for copper-film grain growth by changing the film stress", IP.com Publication No. IPCOM000146542D, (2007), 4 pages.

Zhou Junxiong et al., "Dummy fill effect on CMP planarity", J. of Semiconductors, 31(10), pp. 106003-1 to 106003-4 (2010).

Frieser et al., "Low Temperature Process for Pattering Copper Films Using Resist Masks", IP.com Publication No. IPCOM000065821D, (2005), 1 page.

Tamirisa et al., "Plasma etching of copper films at low temperature", Microelectronic engineering, 84(1), pp. 105-108 (2007).

Wu et al., "Low-Temperature Etching of Cu by Hydrogen-Based Plasmas", ACS Applied Materials & Interfaces, 2(8), pp. 2175-2179 (2010).

Wu et al., "Subtractive Etching of Cu at Low Temperature in Hydrogen-Based Plasmas", ECS Transactions, 44 (1) 299-304 (2012).

* cited by examiner

THIN FILM INTERCONNECTS WITH LARGE GRAINS

FIELD OF THE DISCLOSURE

The present invention relates generally to the formation of interconnect structures in integrated circuits.

BACKGROUND OF THE DISCLOSURE

A persistent trend is towards smaller and smaller integrated circuits. One aspect of attempts to reduce chip size is the reduction in line size for metal interconnects. However, in the current processes, a reduction in line size generally results in a reduction in grain size. In particular, the current design for interconnects in computer chips consists of etching a trench into oxide and filling the trench with a metal, typically copper. This is commonly referred to as damascene processing. For example, dual damascene back-end-of-the-line (BEOL) processing is a leading technique for forming line-via interconnect structures. Because these trenches are shrinking, the grains within the copper are decreasing as well. As a consequence of reduced grain size, there is a corresponding increase in resistance/resistivity in the line due to grain boundary scattering. Surface scattering also increases as the line size is reduced. These factors further contribute to increased resistance/resistivity. However, grain boundary size remains the dominating aspect in increased resistance/resistivity that comes with decreasing line size in the conventional process.

SUMMARY OF THE DISCLOSURE

In one embodiment, the present disclosure describes an integrated circuit that includes a surface of the integrated circuit and an interconnect formed on the surface and comprising a metal. An average grain size of the metal of the interconnect is greater than or equal to half of a line width of the interconnect.

In another embodiment, a method for manufacturing an interconnect of an integrated circuit includes depositing a layer of a metal onto a surface of the integrated circuit, annealing the metal, patterning a first hard mask for placement over the metal and forming a line of the interconnect and a first via of the interconnect by performing a timed etch of the metal using the first hard mask.

In another embodiment, a method for manufacturing an interconnect of an integrated circuit includes depositing a layer of a metal onto a surface of the integrated circuit, where the surface comprises a via opening and where a portion of the metal is deposited in the via opening to form a via of the interconnect. The method further includes: annealing the metal, polishing the metal to a line thickness of a line of the interconnect and patterning the metal to form at least a portion of the line that is aligned to the via.

BRIEF DESCRIPTION OF THE DRAWINGS

The teachings of the present disclosure can be readily understood by considering the following detailed description in conjunction with the accompanying drawings, in which.

DETAILED DESCRIPTION

As technology advances towards smaller integrated circuits, one of the limiting factors is the increasing resistance of metal interconnects as the line size is reduced. In the current processes, a reduction in line size results in a reduction in grain size. In particular, the current design for interconnects in computer chips consists of etching/subtractively patterning a trench into oxide and filling the trench with copper to create a line/interconnect (damascene processing). Because these trenches are shrinking, the grains within the copper are decreasing as well. Large grains cannot exist in such confined areas given the thermal budget for back end of the line (BEOL) processing. As a consequence of reduced grain size, there is a corresponding increase in resistance/resistivity in the line due to grain boundary scattering. In addition, the surface to volume ratio increases as the line size decreases. Thus, surface scattering also increases as the line size is reduced, further contributing to increased resistance/resistivity. However, grain boundary size remains the dominating aspect in increased resistance/resistivity that comes with decreasing line size in the conventional process. For example, it has been shown that for copper lines having a linewidth of approximately ten nanometers or less, grain boundary scattering accounts for approximately two thirds of the total resistivity/resistance. In any case, the increased resistivity/resistance requires greater voltages and greater power to operate.

In contrast to the foregoing, embodiments of the present disclosure include the use of large-grain copper (or other suitable metal such as a copper alloy, aluminum, tungsten, nickel, cobalt, silver, gold, alloys of such metals and so forth) for forming interconnects. For example, in one embodiment large grain copper is grown by annealing a thick blanket of copper followed by a reduction in the thickness of the copper to a desired thickness via polishing and subtractively etching the copper to form an interconnect, e.g., using reactive ion etching (RIE). Thus, the emphasis is on the lithography and patterning over what was previously accomplished with metallurgy. The result is fine lines of copper with large grains and therefore lower resistivity (and lifetime). Additional embodiments describe several exemplary subtractive etching (sub-etch) processes/flows for forming BEOL interconnects.

Figure 1A:
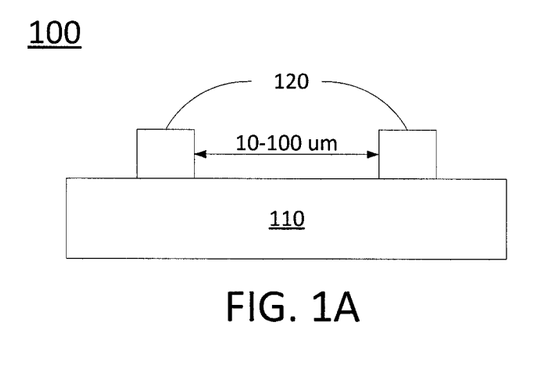
FIGS. 1A-1D illustrate a portion of a first exemplary integrated circuit at various stages in a manufacturing processes.

To aid in understanding the present disclosure, FIGS. 1A-1D illustrate a cross-section of a portion of an exemplary integrated circuit 100 at various stages of an exemplary manufacturing process of the present disclosure. In particular, FIG. 1A illustrates a surface 110 of the integrated circuit 100 as well as two pads or polish stops 120. In one embodiment, the surface 110 may comprise a substrate or die of the integrated circuit, or may comprise an intermediate layer of the integrated circuit at some point in a manufacturing process. The polish stops 120 are disposed on top of the surface 110. In one embodiment the polish stops 120 are formed to have a height that is the desired height of an interconnect that is to be created. In particular, the polish stops 120 may be used in a later stage where a metal that is used to form the interconnect is polished to a desired thickness. In one embodiment, the surface 110 may comprise one of crystalline silicon (Si), germanium (Ge), silicon germanium (SiGe), phosphorous doped silicon (Si:P), carbon doped silicon (Si:C), gallium arsenide (GaAs), or another semiconductor, such as a group III-V compound semiconductor (also referred to as groups 13-15) comprising binary, ternary and quaternary compounds of one or more of boron, aluminium, gallium, indium and thallium with one or more of nitrogen, phosphorus, arsenic, antimony and bismuth. In one embodiment, the polish stops comprise silicon, silicon dioxide ($SiO_2$) or silicon nitride ($Si_3N_4$).

It should be noted that FIGS. 1A-1D do not necessarily illustrate an entire layer or an entire substrate of an integrated circuit. Rather, the figures only show those portions necessary to illustrate aspects of the present embodiments. Thus, although the surface 110 is described as comprising a semiconductor such as silicon, the surface 110 may be part of a larger layer that includes various structures such as already formed interconnects (e.g., lines and vias), gate structures (e.g., gate electrodes, gate dielectrics, etc.), and other structures. In one embodiment, and as illustrated in FIG. 1A, there are two polish stops 120 separated by approximately 10-100 micrometers. In one embodiment, the polish stops 120 are approximately 40 nanometers in each cross-sectional dimension. However, it should be noted that these dimensions are provided for illustrative purposes only. Thus, in other embodiments, other, further and different dimensions may be used for the distance between polish stops and well as for the dimensions of the polish stops. In addition, in other embodiments less than or more than two polish stops may be used in accordance with the present disclosure. For example, a single polish stop, three polish stops, five polish stops, or any other number of polish stops may be used. However, in one embodiment polish stops may be omitted altogether. For instance, a later polishing process may be stopped manually, e.g., by estimation or by other means, rather than by using the polish stops as described below.

In one embodiment, the polish stops 120 are formed using one or more techniques that include lithography, anisotropic or isotropic etching, e.g., plasma etching, reactive ion etching (RIE) or deep reactive ion etching (DRIE), blind hole DRIE, chemical mechanical planarization/polishing (CMP), and the like. In one embodiment, the polish stops 120 are etched from the surface 110. In other words, the polish stops 120 are formed of the same material and are integral with the surface 110. It should also be noted that although two polish stops 120 are shown in FIGS. 1A-1D, the present disclosure is not so limited. For example, in another embodiment only a single polish stop may be used. In still another embodiment, three or more polish stops may be used.

Figure 1B:
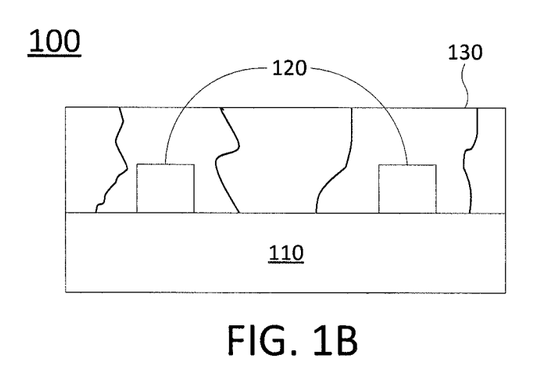

FIG. 1B illustrates a cross-section of the integrated circuit 100 at a next stage where a metal 130 has been deposited or plated onto the surface 110. In one embodiment, the metal comprises copper, aluminum, an alloy of copper (e.g., copper-tungsten-silver, copper-manganese), an alloy of aluminum, tungsten, or any other metal that is used to form integrated circuit interconnects. In one embodiment, the metal 130 is plated such that the metal 130 covers the polish stops 120. The metal that is overplated in this manner may be referred to herein as a "thick-film" metal. In one illustrative embodiment, the metal 130 is plated at a thickness of 1.2 micrometers. In addition, in one embodiment, the metal 130 shown in FIG. 1B has been annealed at high temperature, e.g., greater than 400 degrees centigrade, in order to produce large grain sizes. The grain boundaries are illustrated in FIG. 1B as the non-straight segments that cross the metal 130. Notably, the anneal produces relatively large grain sizes. For example, the grains may have an average diameter of approximately 1 micrometer (the distance from grain boundary to grain boundary across the grain) or greater.

Figure 1C:
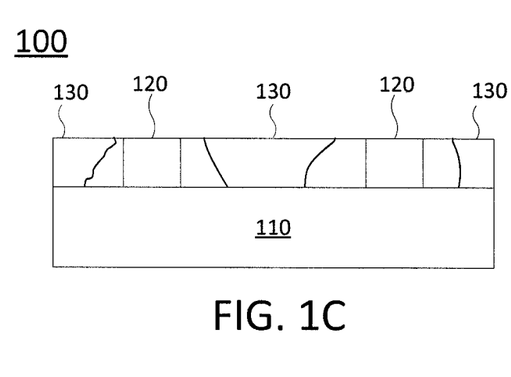

FIG. 1C illustrates a cross-section of the integrated circuit 100 at a next stage after the metal 130 has been polished to a desired thickness. For example, as shown in FIG. 1C the metal 130 has been polished to reduce the thickness to the height of the polish stops 120. For example, if the polish stops are 40 nanometers in height, the thickness of the metal 130 in FIG. 1C may also be 40 nanometers. A metal that has been polished to reduce the thickness to a desired size in this manner may be referred to herein as a "thin-film" metal. Note that in FIG. 1C, the grain boundaries have not been changed; thus, the portions of the metal 130 that have not been polished away retain the same grain boundary profile. In one embodiment, the metal 130 has been polished to the desired thickness using chemical mechanical planarization (CMP), where the CMP process is stopped when the top of the polish stops 120 is reached.

Figure 1D:
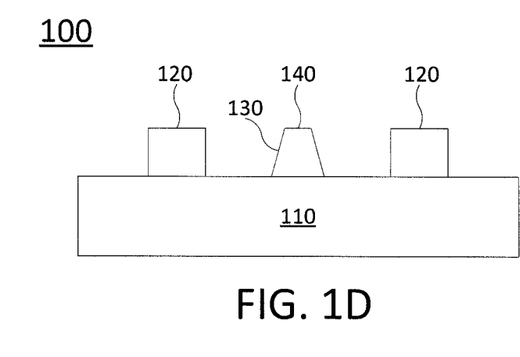

FIG. 1D illustrates a cross-section of the integrated circuit 100 at a next stage after the metal 130 has been patterned and etched to a desired linewidth. In particular, the metal 130 has been formed to create an interconnect 140, e.g., comprising a line, that has some narrow cross-section relative to a much greater length. For example, the cross section of the interconnect 140 is in the plane of the page, while its length extends perpendicular to the plane of the page, e.g., into and/or out from the page. In one embodiment, the interconnect 140 is created by lithography and/or electron beam patterning and etching of the metal 130. For example, interconnect 140 may be formed by depositing and patterning a hard mask over the metal and etching the metal. In one embodiment, the interconnect 140 has a cross-sectional profile where the height is two times the linewidth, where the linewidth may range from approximately 2 nanometers to 80 nanometers. In one embodiment, the linewidth is 20 nanometers or less (with the interconnect having a height/thickness of approximately 40 nanometers). In one particular embodiment, the linewidth is 10 nanometers or less. In addition, in one embodiment the interconnect 140 has a taper angle of 70-90 degrees. It is noted that these dimensions and ratios are provided for illustrative purposes. Thus, other embodiments may employ interconnects with various linewidths, and ratios of the linewidth to height as desired or as required for a particular application.

Figure 2:
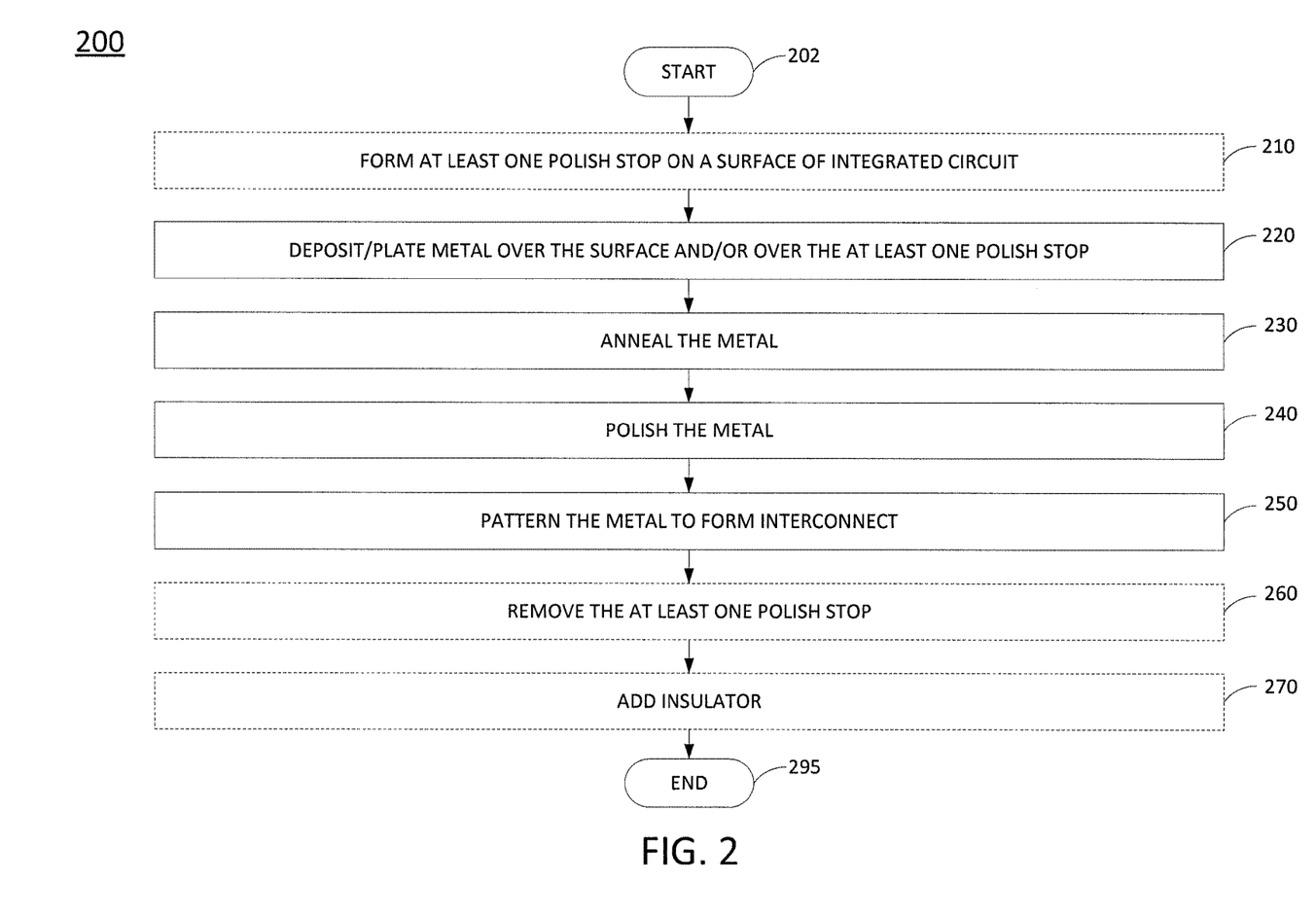
FIG. 2 illustrates a flowchart of an exemplary method, according to the present disclosure.

To further aid in understanding, FIG. 2 illustrates a flowchart of an exemplary method 200 for manufacturing an integrated circuit in accordance with the present disclosure. In particular, the method 200 may reflect aspects of the fabrication of the above described integrated circuit as illustrated in FIGS. 1A-1D.

The method 200 is initialized at step 202 and proceeds to optional step 210 (illustrated in phantom), where the method forms at least one polish stop on a surface of an integrated circuit chip. In one embodiment, the surface may comprise a substrate or die of the integrated circuit, e.g., at some point prior to the completion of the integrated circuit, or may comprise an intermediate layer of the integrated circuit at some point in a manufacturing process. For example, the surface may comprise silicon, germanium, silicon-germanium, gallium arsenide, borosilicate glass, phosphorous doped silicon (Si:P), carbon doped silicon (Si:C), silicon dioxide ($SiO_2$), silicon nitride ($Si_3N_4$), silicon oxynitride (SiON), an ultra-low-k (ULK) dielectric such as silicon dioxide doped with fluorine, chlorine or the like, $SiOCH_3$, a group III-V compound semiconductor, or other semiconductor or similar material that is suitable for etching, lithography and other microelectronic fabrication techniques. In one embodiment, the at least one polish stop comprises silicon or silicon dioxide. In one embodiment, the at least one polish stop is formed from a base material comprising the surface. For example, lithography, anisotropic or isotropic etching, e.g., plasma etching, reactive ion etching (RIE) or deep reactive ion etching (DRIE), blind hole DRIE, chemical mechanical planarization (CMP), and the like may be applied to the surface to form features comprising the at least one polish stop. In another embodiment, the at least one polish stop is formed from material that is first deposited or grown on the surface, and which may then be etched to desired dimensions using one or more of the same techniques mentioned above. Thus, in one embodiment the at least one polish stop may comprise the same material as the surface of the integrated circuit, while in another embodiment, the at least one polish stop is of a different material as the surface of the integrated circuit.

In one embodiment, the at least one polish stop is formed with a thickness/depth that is the same as a desired thickness of a thin-film of the metal to be deposited at step 220. In one example, the desired thickness may be associated with a target linewidth of 2-80 nanometers. For example, to form an eventual interconnect/line with a 20 nanometer line width, a 40 nanometer thick polish stop may be formed. This will support the creation of a thin-film metal of 40 nanometers thickness/height which can then be etched to have a 20 nanometer width resulting in a desirable 2:1 aspect ratio as described in steps 220-240 below. An exemplary surface having at least one polish stop deposited thereon is shown in FIG. 1A and discussed above. It should also be noted that in one example, step 210 may be considered an optional step.

At step 220, the method 200 deposits/plates a metal over the surface and/or over the polish stops. In one embodiment, the metal comprises copper, aluminum, an alloy of copper or aluminum, or any other metal that is used to form integrated circuit interconnects. In one embodiment, step 220 comprises depositing, plating or growing a thick-film of the metal over the surface. As used herein the terms depositing, growing and plating are intended to be used interchangeably to refer to any process for creating a metallic layer over the surface. For example, in one embodiment step 220 comprises sputtering or plasma-enhanced sputtering of the metal, electroplating or electrochemical plating of the metal on the surface, epitaxial growth of the metal on the surface (e.g., copper on silicon), chemical vapor deposition (CVD) (e.g., deposition of copper on a titanium nitride (TiN) seed layer), physical vapor deposition (PVD), atomic layer deposition (ALD), successive ionic layer adsorption and reaction (SILAR), and so forth. In one embodiment the metal is deposited to form a layer of the metal that is greater than one micrometer in thickness, e.g., 1.2 micrometers. In one embodiment, the metal is plated such that the metal also covers the at least one polish stop (e.g., if the method 200 is performed to include the optional step 210).

At step 230, the method 200 anneals the metal that is deposited at step 220. In one embodiment, the anneal is performed at a high temperature, e.g., 200-500 degrees centigrade. Notably, the anneal of metallic films has been demonstrated to produce larger grain size (e.g., as compared to no anneal). Thus, for example, the anneal at step 230 may produce average grain sizes of approximately 1 micrometer in diameter (the distance from grain boundary to grain boundary across the grain), average grain sizes equal to the linewidth or one half of the linewidth of a resulting interconnect, and average grain sizes approximately equal to the thickness of the metal film and/or the thickness of the at least one polish stop, and so forth. It is noted that in general, the larger the grain size, the greater reduction in grain boundary scattering. In addition, the smaller the size of the interconnect, the greater percentage reduction in grain boundary scattering and resistivity/resistance (as compared to forming an interconnect of the same dimensions using damascene processing). An exemplary surface having a metal deposited thereon and that has been annealed is shown in FIG. 1B and described above.

At step 240, the method 200 polishes the metal that has been annealed at step 230. In particular, step 240 comprises reducing the thickness of the metal layer from a thick-film to a thin-film. For example, if the desired thickness/height of an interconnect is 40 nanometers, then the polishing may reduce a thick-film layer of the metal from greater than 1 micrometer to only 40 nanometers (a "thin-film"). In one embodiment, the polishing comprises reducing the thickness of the metal until reaching the at least one polish stop. In one embodiment, step 240 comprises polishing the metal to the desired thickness using chemical mechanical planarization (CMP). For instance, when the method 200 is performed using optional step 210, the CMP process may be implemented and stopped when the top of the at least one polish stop is reached. Notably, the polishing performed at step 240 does not change the grain boundaries of the metal that are imparted via the anneal at step 230. Rather, the portions of the metal that have not been polished away and that remain in the thin-film of the metal retain the same grain boundary profile as before the polishing. An exemplary surface having a thin-film metal formed thereon is shown in FIG. 1C and described above.

At step 250, the method 200 patterns the metal to form an interconnect, e.g., a line or via in a backend of the integrated circuit. For example, step 250 may comprise lithography, extreme ultraviolet lithography (EUV or EUVL) and/or electron beam patterning and etching of the metal to form the interconnect to desired dimensions. For example, the interconnect may be formed by depositing and patterning a hard mask for placement over the metal and etching the metal using the hard mask. The hard mask may comprise at least one of tungsten, tantalum, tantalum nitride, niobium or vanadium and the etching may comprise reactive ion etching (RIE), physical sputtering, wet etching, or a combination of such techniques. In one embodiment, the metal may be etched to have a linewidth that is half of the thickness of the thin-film from which it is formed. For instance, if the metal has a thickness of 40 nanometers, the interconnect may be etched to have a linewidth of 20 nanometers (e.g., a 2:1 aspect ratio). Similarly, if the thickness of the metal is 20 nanometers, the etch may create an interconnect with a linewidth of 10 nanometers. In addition, in one embodiment the resulting interconnect may be formed to have a taper angle of 70-90 degrees. It should be noted that these examples are provided for illustrative purposes only and that other embodiments may utilize various other dimensions and/or aspect ratios that are larger or smaller than any specific examples mentioned herein. For instance, practical linewidths of 10 nanometers and less have recently been demonstrated. Even smaller linewidths may be achieved through the use of the operations described herein in accordance with the present disclosure, e.g., to 2 nanometers or less. In one embodiment, step 240 may also include forming or depositing a liner over the interconnect. For example, the liner may comprise a layer of tantalum (Ta), tantalum nitride (TaN), titanium (Ti) or titanium nitride (TiN), or a combination thereof.

Following step 250, the method 200 may proceed to optional step 260. In optional step 260, the method 200 may remove the at least one polish stop. For example, the method 200 may remove the at least one polish stop using a lithography and etching process, a CMP process, and the like. In one example, step 260 may be performed simultaneously or in conjunction with the operation of step 250.

The method 200 may also include optional step 270 following step 250 or optional step 260. At optional step 270 the method 200 adds an insulator to the integrated circuit. For example, step 270 may comprise deposition or growth of an insulator adjacent to or surrounding the interconnect formed at step 250. In one embodiment, the insulator added at step 270 fills the space(s) between two or more interconnects. For instance, the method 200 may grow silicon dioxide, e.g., by silicon oxidation, CVD, physical vapor deposition (PVD), plasma-enhanced CVD (PECVD), and so forth. Notably, any suitable insulator/dielectric for use in an integrated circuit may be deposited at step 270 using any suitable technique for deposition or growth. For instance, low-k dielectrics (e.g., having a k-value of approximately 1.0 and 2.8), carbon doped oxide dielectrics such as (SiCOH), and the like, may be used instead of or in addition to silicon dioxide. In one embodiment, the insulator comprises or one or more air gaps. It should be noted that in one embodiment the insulator deposited at step 270 may be the same material as the at least one polish stop and/or the surface on which the metal is deposited. As such, in one embodiment the method may proceed from step 250 to step 270, skipping step 260. In this instance, step 270 may simply fill-in around the interconnect that is formed at step 250 with the insulator, where the polish stops and the insulator eventually become indistinguishable.

Following any of steps 250-270, depending upon the particular implementation, the method then proceeds to step 295 where the method ends. To the extent not otherwise specified above it should be noted that one or more steps, functions or operations of method 200 may be omitted, or may be considered as pre-processing steps.

Presently, dual damascene back-end-of-the-line (BEOL) processing is a leading technique for forming line-via interconnect structures. In contrast, the examples described above in connections with FIGS. 1A-1D and 2 relate to a subtractive technique where the metal is polished and etched. In this regard, further examples of the present disclosure are described below in connection with FIGS. 3A-3G, 4A-4E and 5A-5I which relate to several exemplary subtractive etching (sub-etch) processes/flows for forming BEOL interconnects. The examples of FIGS. 3A-3G, 4A-4E and 5A-5I are intended to supplement and/or replace damascene processing techniques. In particular, FIGS. 3A-3G relate to a subtractive etch flow incorporating damascene processing, for forming a via, in combination with a subtractive line etch, for forming a line. FIGS. 4A-4E relate to a subtractive etch flow incorporating a subtractive line etch in combination with a subtractive via etch. Finally, FIGS. 5A-5I relate to a subtractive etch flow incorporating damascene processing for forming a via in combination with a subtractive line etch and a subtractive via etch.

FIGS. 3A-3G illustrate a subtractive etch process/flow for forming an interconnect in which a via is formed using a damascene process while a connecting line is formed in a subtractive etch process. As illustrated in FIGS. 3A-3G, the subtractive etch process includes stages 300A-300G. As such, the process serves as a flow diagram illustrating portions of one embodiment of a method for fabricating a portion of an integrated circuit 310 (i.e., an interconnect structure), according to the present disclosure. In addition, it should be noted that the process is divided into different stages for convenience of explanation only. In other words, exemplary subtractive etch processes in accordance with the present disclosure may include various additional sub-steps or sub-processes, may perform operations in an order that is different from that which is illustrated, and so forth.

Figures 3A, 3B:
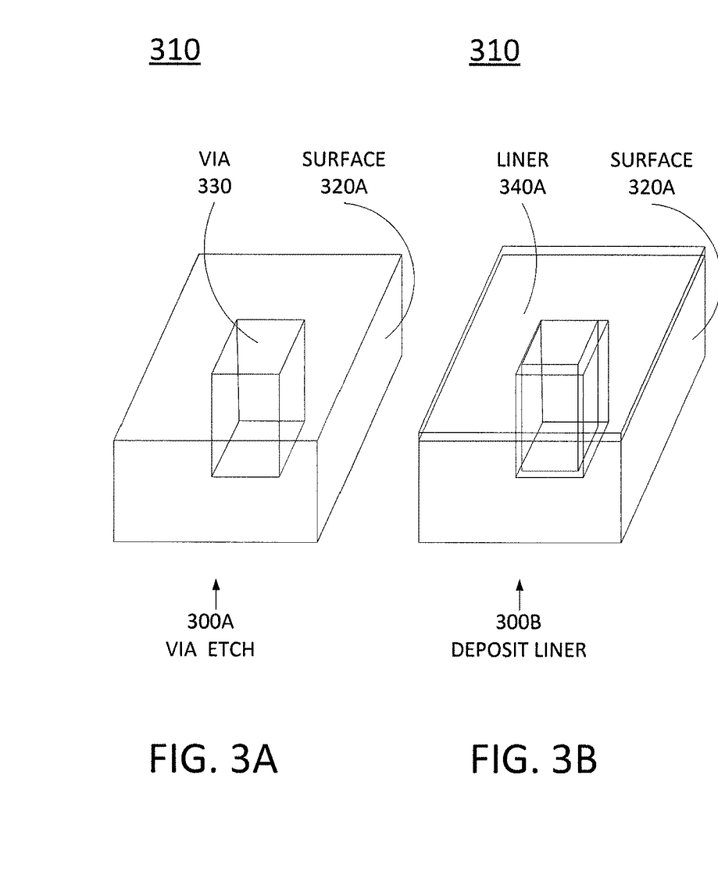
FIGS. 3A-3G illustrate a portion of a second exemplary integrated circuit at various stages in a manufacturing process.

At stage 300A, the integrated circuit 310 includes surface 320A which may comprise a dielectric insulator, substrate and/or an intermediate layer of the backend of the integrated circuit 310 (e.g., crystalline silicon, germanium, silicon germanium, phosphorous doped silicon, carbon doped silicon, gallium arsenide, silicon dioxide ($SiO_2$), silicon nitride ($Si_3N_4$), silicon oxynitride (SiON), an ultra-low-k (ULK) dielectric such as silicon dioxide doped with fluorine, chlorine or the like, $SiOCH_3$, a group III-V compound semiconductor and so forth). For example, stage 300A may illustrate the integrated circuit 310 at an intermediate stage in the processing. For the purpose of clarity, several fabrication steps leading up to the production of the integrated circuit 310 as illustrated in stage 300A are omitted. In other words, the integrated circuit 310 does not necessarily start out in the form illustrated in stage 300A, but may develop into the illustrated structure over several well-known processing steps which are not illustrated but are well-known to those of skill in the art. For example, an opening for a via 330 (e.g., a through-silicon via (TSV)) may be formed by etching the surface 320A. For instance, the etch may comprise reactive ion etching (RIE), deep reactive ion etching (DRIE) and so forth.

At stage 300B, a first liner 340A is deposited over surface 320A. In one embodiment, the first liner 340A comprises tantalum nitride (TaN), tantalum (Ta), cobalt (Co), manganese (Mn), a manganese oxide ($MnO_x$), or a manganese silicate ($MnSi_xO_y$)). For example, the first liner 340A may be plated/deposited by sputtering or plasma-enhanced sputtering, electroplating or electrochemical plating, epitaxial growth), chemical vapor deposition (CVD), atomic layer deposition (ALD), successive ionic layer adsorption and reaction (SILAR), and so forth. In one embodiment, the first liner 340A is deposited having a width of approximately 2 nanometers. In addition, it should be noted that the first liner 340A also covers the surfaces of the via opening 330 formed in the substrate 320A.

At stage 300C, an interconnect metal 350, such as copper (Cu) (or other suitable metal such as a copper alloy, aluminum (Al), tungsten (W), nickel (Ni), cobalt (Co), silver (Ag), gold (Au), alloys of such metals and so forth) for forming interconnects, is plated over the first liner 340A, e.g., using any available deposition/plating technique such as those described above. Notably, the interconnect metal 350 plated at stage 300C also fills the opening for via 330, e.g., a damascene-patterned via level. In one embodiment, stage 300C also comprises polishing and/or planarizing the interconnect metal to a desired line thickness and uniformity of a line of the interconnect, e.g., using CMP. For example, the interconnect metal 350 that is deposited/plated may vary in thickness from one portion to another, and may have a larger thickness than desired for the line. Thus, polishing may be applied to reduce the thickness to a desired thickness for the line and to render the surface of the interconnect metal 350 more uniform. In one embodiment, one or more polish stops may be formed on the surface 320A such that the polishing process can be stopped in the same or a similar manner to that described above in connection with the examples of FIGS. 1A-1D and FIG. 2.

Figure 3C:
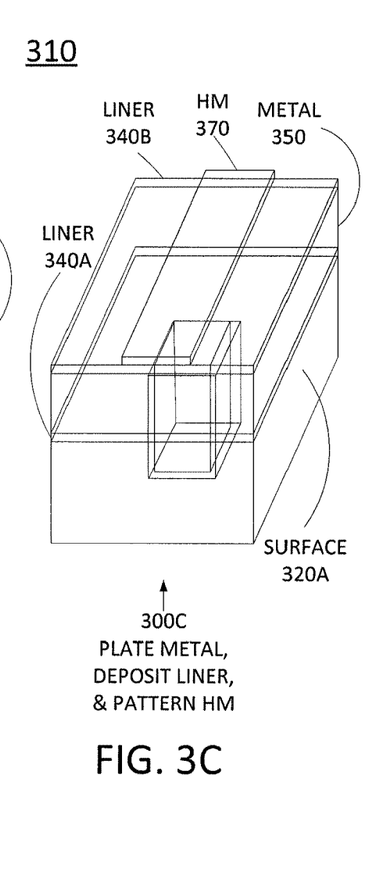

In addition, at stage 300C, a second liner 340B is also deposited over the interconnect metal 350. The second liner 340B may comprise the same material or material(s) used for the first liner 340A. In one embodiment, the second liner 340B is deposited having a thickness of twice that of the first liner 340A. Thus, for example, if the first liner 340A has a thickness of 2 nanometers, the second liner 340B may be formed to have a thickness of 4 nanometers.

Figure 3D:
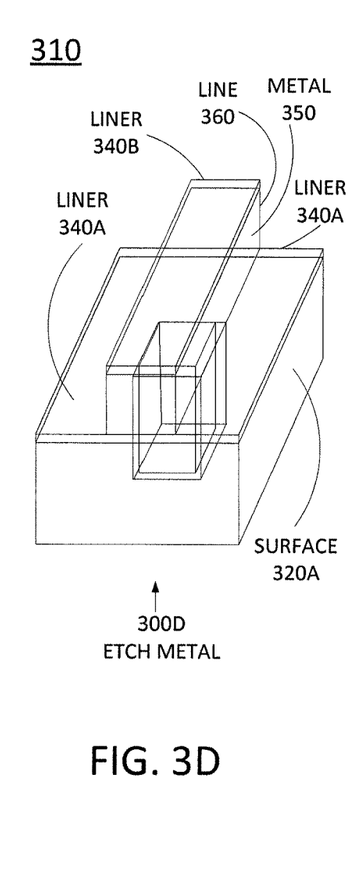

A hard mask (HM) 370 is also formed over a portion of the second liner 340B. For instance, hard mask 370 may have the same length and width as a desired length and width for the line to be formed from the interconnect metal 350. In one embodiment, the hard mask 370 comprises any material with a slow etch rate relative to the interconnect metal 350. For example, the hard mask 370 may comprise tungsten (W), tantalum (Ta), niobium (Nb) or vanadium (V). In one embodiment, the hard mask 370 may comprise the same material or material(s) used for the first liner 340A and/or second liner 340B. In such case, the hard mask 370 may be deposited with a sufficient thickness such that the portion of the second liner 340B beneath the hard mask 370 is not reached during the etch at stage 300D (described below). In addition, in one embodiment at stage 300C an anneal is performed after the interconnect metal 350 is plated or after the second liner 340B is deposited. For example, the anneal may comprise a high temperature anneal as described above. Notably, the anneal forms a continuous grain structure with large grain size in the interconnect metal 350.

At stage 300D, the interconnect metal 350 is etched to form the basic structure of the line. In particular, the etch removes material at a faster rate over portions not covered by the hard mask 370. In accordance with the present disclosure, the etch at stage 300D may comprise any available etching technique, such as reactive ion etching (RIE), deep reactive ion etching (DRIE) and so forth. The result is shown in FIG. 3D at stage 300D where a significant portion of the interconnect metal 350 has been removed and the first liner 340A has been re-exposed. In one embodiment, the etch is stopped when light scattering occurs. For example, the first liner 340A may comprise tantalum, which will scatter a particular light pattern when the etch penetrates through the interconnect metal 350 and reaches the first liner 340A. In one embodiment, if any of the hard mask 370 remains after the etch is stopped, then the excess of hard mask 370 may be removed. Notably, after the etch the essential structure of the line-via interconnect is in place. For instance, the location for the via has been previously indicated by the numeral 330 while the line portion is identified by the numeral 360.

Figures 3E, 3F:
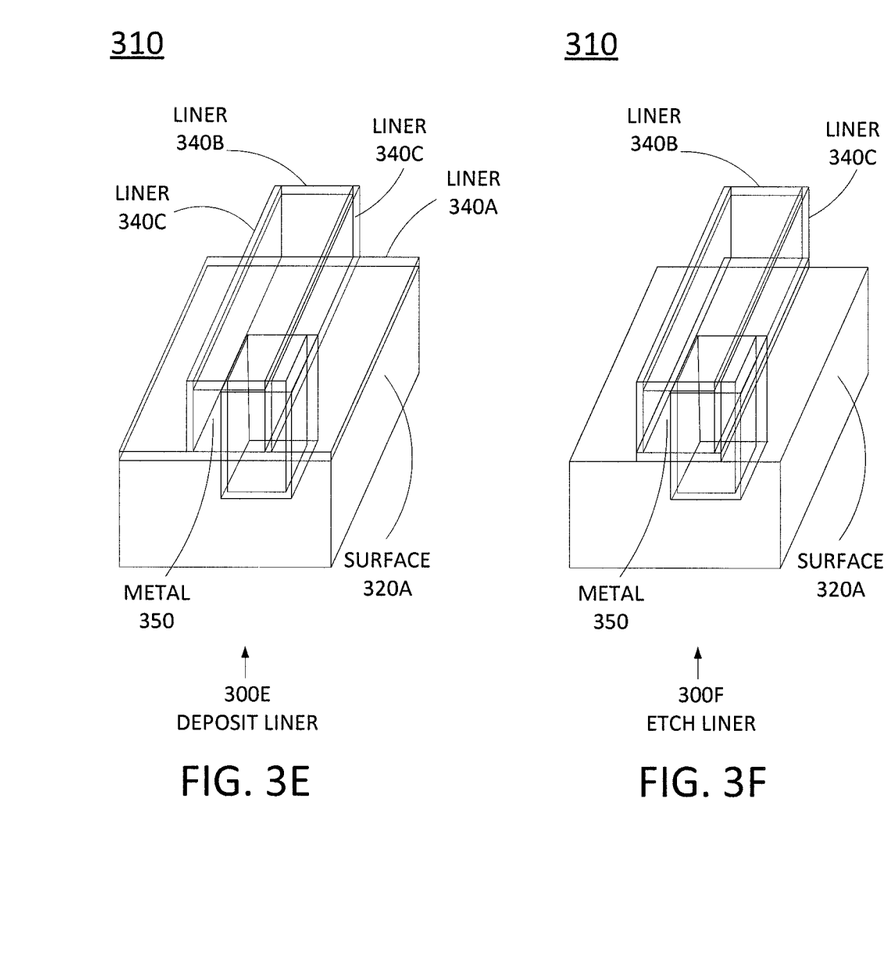

At stage 300E, liner is again deposited. In this case, a third liner 340C is formed on the exposed sides of the line of interconnect metal 350. In one embodiment, the liner is deposited having the same thickness as the liner 340A deposited at stage 300B. Notably, the deposit of the liner at stage 300E also builds up the remaining portions of the first liner 340A and second liner 340B. Thus, for example, if stage 300E involves the deposit of a 2 nanometer thick layer of liner, then the resulting thickness will be: first liner 340A—4 nanometers; second liner 340B—6 nanometers; third liner 340C—2 nanometers.

Stage 300F comprises a liner etch to remove the first liner 320A over a portion of the surface 320A. For example, the etch may comprise a directional etch using any available etching technique and which removes only the thickness of the first liner 340A over a face of the surface 320A (e.g., the upward facing portion of surface 320A as illustrated in FIG. 3F). For example, a directional etch effectively removes material only from faces which are perpendicular to the direction of the etch. Notably, the etch at stage 300F may also remove a portion of the second liner 340B, e.g., the same thickness as the thickness of the first liner 340A to be removed. Thus, for example, if the first liner 340A has a thickness of 4 nanometers and if the second liner 340B has a thickness of 6 nanometers, then 4 nanometers of the second liner 340B will also be removed. A 2 nanometer thick layer remains for second liner 340B. In addition, since the etch may comprise a directional etch, the third liner 340C may remain at 2 nanometers thickness. It should further be noted that a portion of the first liner 340A remains beneath the line formed from the copper 350A, e.g., also at 2 nanometers thickness. Advantageously, a nominal amount of liner surrounds the line-via interconnect (e.g., the structure formed from the interconnect metal 350 comprising the via 330 and the line 360 formed above the via opening 330). For example, the remaining liner aids in adhesion, boundary protection and so forth.

Figure 3G:
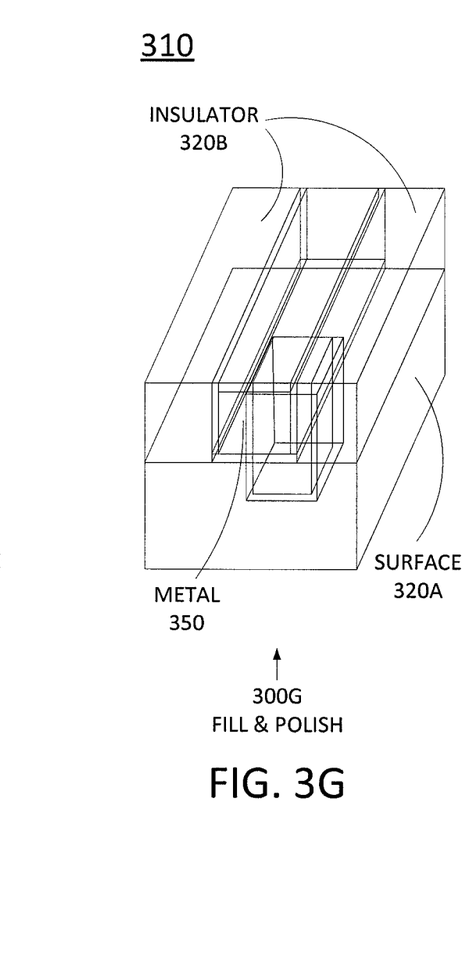

Stage 300G includes filling the integrated circuit 310 with additional insulator 320B, which may be a material of the same or different composition as that of surface 320A, such as a dielectric insulator and/or ultra-low-k (ULK) material, e.g., having a k-value in the range of approximately 1.0 to 2.8. In one example, the insulator 320B is deposited by at least one of spin-on, physical vapor deposition (PVD) or chemical vapor deposition (CVD). In one example, the insulator 440 includes at least one air gap, e.g., to reduce the k-value of the overall structure of the insulator 440 (since the k-value of air is 1.0). In addition, stage 300G may also include polishing and/or chemical mechanical planarization (CMP) to produce a substantially uniform (top) surface of the integrated circuit 310.

As mentioned above, stage 300C may include an anneal that is performed after the interconnect metal 350 is plated or after the second liner 340B is deposited. Notably, the anneal forms a continuous grain structure in the interconnect metal 350, i.e., between the via portion 330 and the line portion 360 of the interconnect metal 350. Accordingly, both material continuity and grain continuity of the interconnect is achieved, thereby resulting in a lower resistance as compared to techniques that result in a defined line-via boundary. In addition, aside from the formation of the opening for via 330 at stage 300A, the dielectric(s)/ULK material(s) (surface 320A, insulator 320B) are not subjected to reactive ion etching (RIE), which decreases the capacitance of the ULK. In other words, the capacitance of the ULK is improved compared to other techniques, e.g., dual damascene processing.

FIGS. 4A-4E illustrate a second subtractive etch process including stages 400A-400E for forming a line-via interconnect portion of an integrated circuit 410. Notably, the example of FIGS. 4A-4E comprises a dual subtractive etch process where both the line and the via are formed by subtractive etching. As such, the process serves as a flow diagram illustrating portions of one embodiment of a method for fabricating a portion of an integrated circuit 410 (i.e., an interconnect structure), according to the present disclosure. In addition, it should be noted that the process is divided into different stages for convenience of explanation only. In other words, exemplary subtractive etch processes in accordance with the present disclosure may include various additional sub-steps or sub-processes, may perform operations in an order that is different from that which is illustrated, and so forth.

Figure 4A:
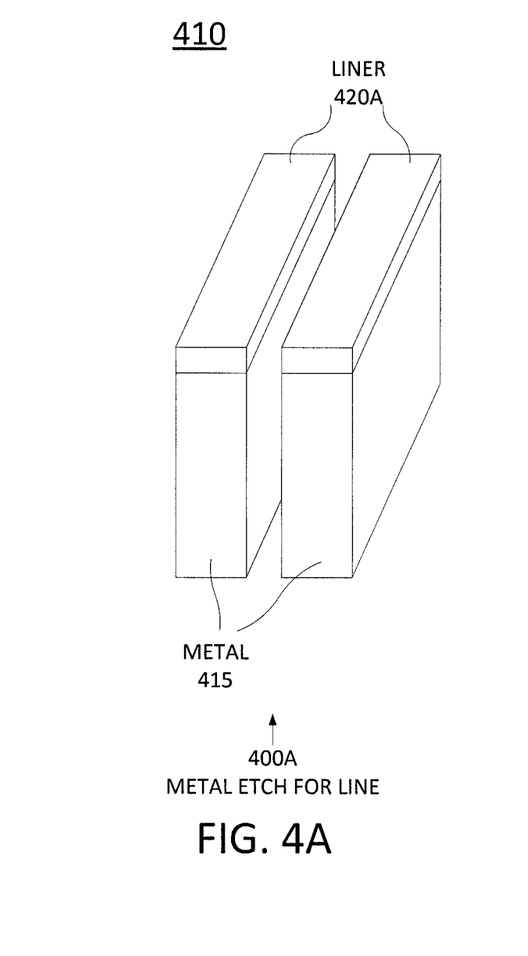
FIGS. 4A-4E illustrate a portion of a third exemplary integrated circuit at various stages in a manufacturing process.

At stage 400A a first liner 420A is deposited over a blanket section of interconnect metal 415 (e.g., copper or other interconnect metal as described above). In one example, stage 400A includes or is preceded by an anneal of the interconnect metal 415 such that the interconnect metal 415 comprises large grains. Thus, stage 400A may illustrate the integrated circuit 410 at an intermediate stage in the processing. For the purpose of clarity, several fabrication steps leading up to the production of the integrated circuit 410 as illustrated in stage 400A are omitted. In other words, the integrated circuit 410 does not necessarily start out in the form illustrated in stage 400A, but may develop into the illustrated structure over several well-known processing steps which are not illustrated but are well-known to those of skill in the art.

In stage 400A, the interconnect metal 415 is also etched to form at least one portion (two portions are illustrated at stage 400A). In one example, the etch produces the one or more portions of interconnect metal having a high aspect ratio, e.g., 4:1, and/or with a high taper angle, e.g., greater than or equal to approximately 87 degrees, to be used for forming a line-via interconnect. In another embodiment, the taper angle may be anywhere within the range of 70 to 90 degrees. Stage 400A also includes the deposition of a first liner 420A over a surface of the interconnect metal 415. The first liner 420A may comprise the same liner material or materials described above in connection with the example of FIGS. 3A-3G.

Figure 4B:
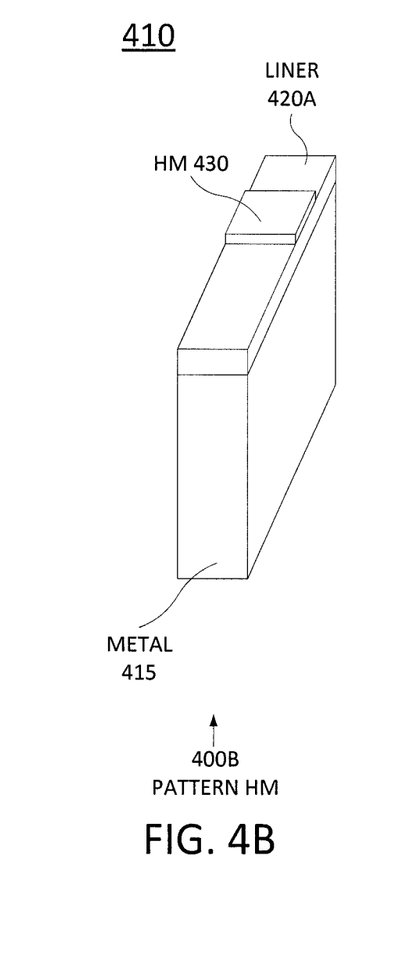

At stage 400B, a hard mask 430 is formed over a portion of the first liner 420A. For instance, hard mask 430 may have the same dimensions as the desired cross-sectional dimensions of a via to be formed from the interconnect metal 415. In addition, the hard mask 430 may comprise any of the same materials suitable for use as the hard mask 370 described above in connection with FIG. 3C.

Figure 4C:
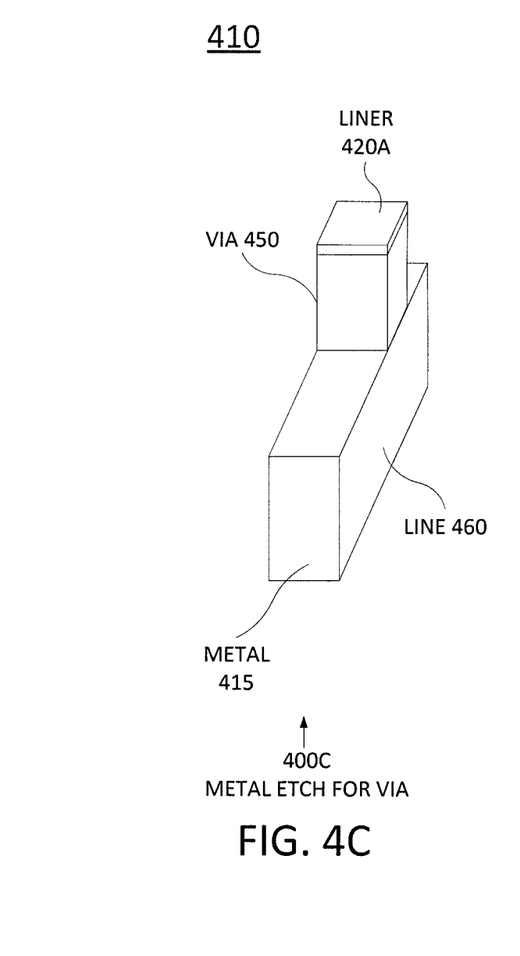

At stage 400C, the interconnect metal 415 is etched, e.g., using reactive ion etching (RIE) or the like. In one example, the etch comprises a timed etch since there is no etch stop layer. Notably, after the etch the essential structure of the line-via interconnect is in place. For instance, the via portion is indicated by numeral 450 while the line portion is identified by the numeral 460. In one example, any remaining portion of the hard mask 430 may be removed, e.g., by CMP. In the present example, the interconnect metal 415 is first etched at stage 400A to have 4:1 aspect ratio. Accordingly, the etch at stage 400C may be applied and halted such that the via 450 and the line 460 each have a 2:1 aspect ratio.

Figure 4D:
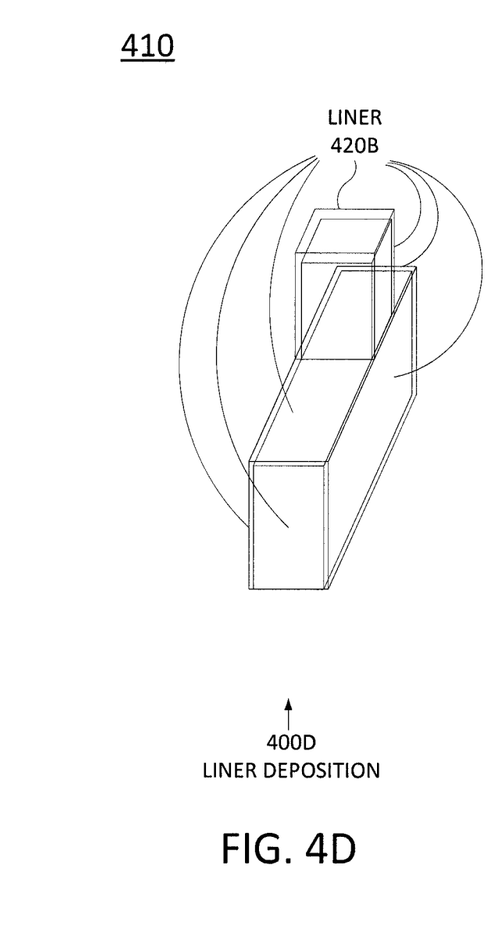
Figure 4E:
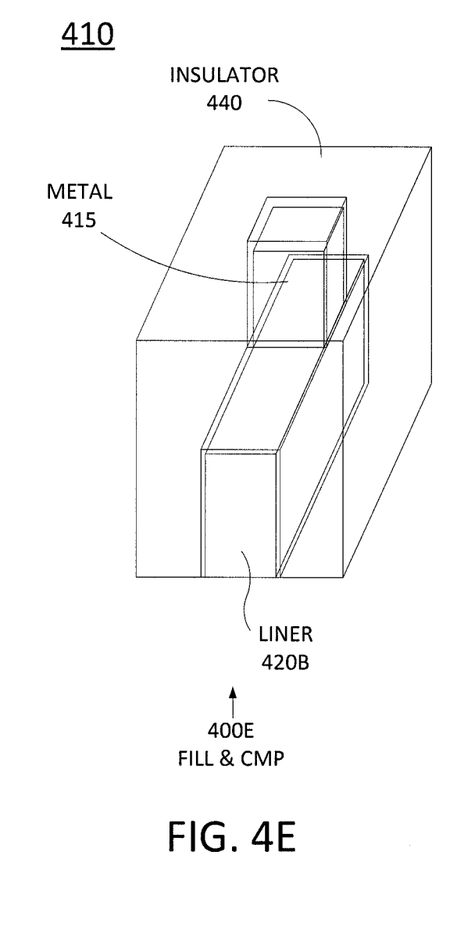

At stage 400D a second liner 420B is deposited on the interconnect metal 415. In one embodiment, the deposition of the second liner 420B is selective such that only the interconnect metal 415 is lined. In one embodiment, the second liner 420B comprises a self-aligned liner such as cobalt (Co), nickel (Ni) or alloys thereof with tungsten (W), potassium (P), molybendium (Mo) and the like, e.g., CoWP, NiMoP, and so forth.

At stage 400E, the insulator 440, e.g., a dielectric and/or ultra-low-k (ULK) material, is filled in around the interconnect metal 415. In one example, the insulator 440 is deposited by at least one of spin-on, physical vapor deposition (PVD) or chemical vapor deposition (CVD). In one example, the insulator 440 includes at least one air gap. In addition, the upper surface of the integrated circuit 410 may be polished, e.g., via CMP to provide a substantially uniform surface. Notably, the second liner 420B and/or first liner 420A still may cover the upper surface of the via 450 of the interconnect prior to stage 400E. Thus, the via 450 may remain exposed to allow the via 450 to be connected to additional structures and/or additional layers. Notably, the process of FIGS. 4A-4E results in grain continuity and material continuity between the via 450 and the line 460. In other words, the line 460 and the via 450 of the interconnect share at least one common grain. The process also provides for large grains through the anneal performed prior to or as part of stage 400A.

FIGS. 5A-5I illustrate still another sub-etch process including stages 500A-500I for forming a via-line-via interconnect structure portion of a integrated circuit 510. Notably, the example of FIGS. 5A-5I comprises a damascene process in combination with a dual subtractive etch process for forming a via-line-via interconnect. The process may be considered as a combination of aspects of the processes described in connection with FIGS. 3A-3G and 4A-4E. As such, the process of FIGS. 5A-5I serves as a flow diagram illustrating portions of one embodiment of a method for fabricating a portion of an integrated circuit 510 (i.e., an interconnect structure), according to the present disclosure. In addition, it should be noted that the process of FIGS. 5A-5I is divided into different stages for convenience of explanation only. In other words, exemplary subtractive etch processes in accordance with the present disclosure may include various additional sub-steps or sub-processes, may perform operations in an order that is different from that which is illustrated, and so forth.

Figure 5A:
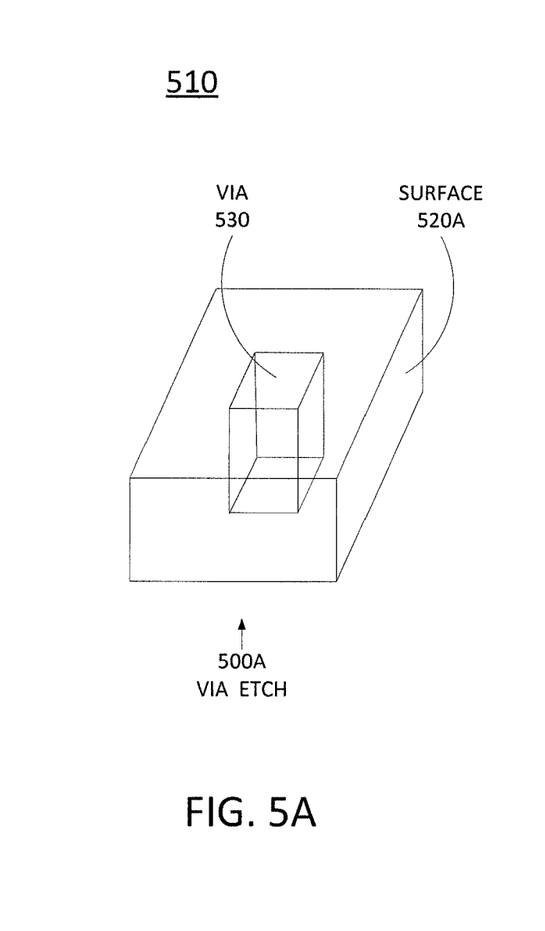
FIGS. 5A-5I illustrate a portion of a fourth exemplary integrated circuit at various stages in a manufacturing process.

At stage 500A, the integrated circuit 510 includes a surface 520A (e.g., a substrate or intermediate layer comprising any of the materials described above in connection with surface 320A of FIGS. 3A-3G). For example, stage 500A may illustrate the integrated circuit 510 at an intermediate stage in the processing. For the purpose of clarity, several fabrication steps leading up to the production of the integrated circuit 510 as illustrated in stage 500A are omitted. In other words, the integrated circuit 510 does not necessarily start out in the form illustrated in stage 500A, but may develop into the illustrated structure over several well-known processing steps which are not illustrated but are well-known to those of skill in the art. For example, a via opening 530 for a first via may be formed by etching the surface 520A.

Figure 5B:
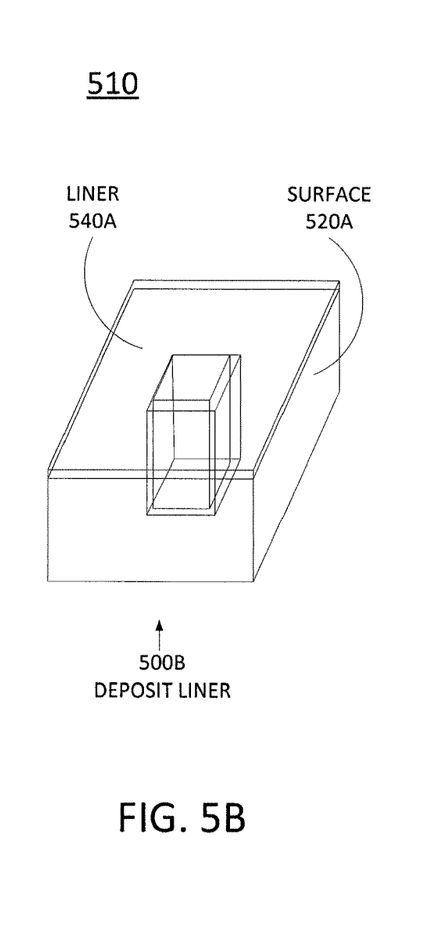

At stage 500B, a first liner 540A is deposited over surface 520A. In one embodiment, the first liner 540A comprises any of the materials suitable for use as a liner and as described above in connection with liners 340A, 340B, 420A and 420B. For example, the first liner 540A may be plated/deposited by sputtering or plasma-enhanced sputtering, electroplating or electrochemical plating, epitaxial growth), chemical vapor deposition (CVD), atomic layer deposition (ALD), successive ionic layer adsorption and reaction (SILAR), and so forth. In one embodiment, the first liner 540A is deposited having a width of approximately 2 nanometers. In addition, it should be noted that the first liner 540A also covers the surfaces of an opening for a first via 530 formed in the surface 520A.

Figure 5C:
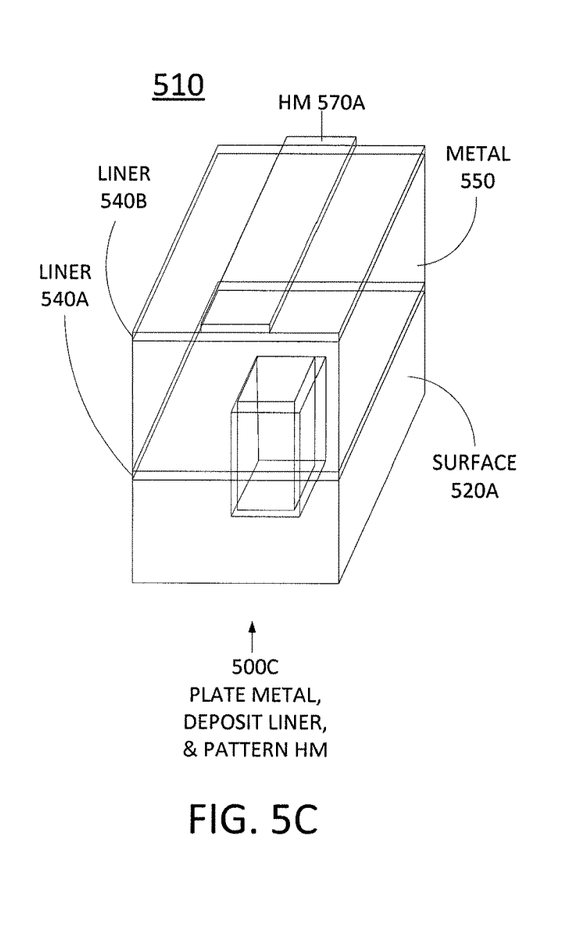
Figure 5D:
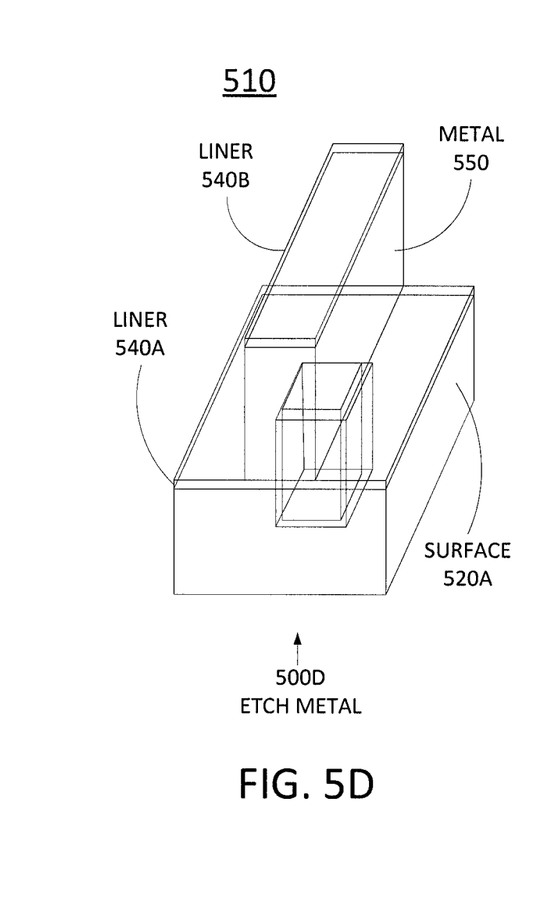

At stage 500C, an interconnect metal 550, such as copper or other suitable metal as described above is plated over the first liner 540A, e.g., using any available deposition/plating technique such as those described above. Notably, the interconnect metal 550 plated at stage 500C also fills via opening 530. In addition, at stage 500C, a second liner 540B is also deposited over the interconnect metal 550. The second liner 540B may comprise the same material or material(s) that may be used for the first liner 540A. In one embodiment, the second liner 540B is deposited having a thickness of twice that of the first liner 540A. Thus, for example, if the first liner 540A has a thickness of 2 nanometers, the second liner 540B may be formed to have a thickness of 4 nanometers. A first hard mask (HM) 570A is also formed over a portion of the second liner 540B. For instance, first hard mask 570A may have the same length and width as a desired length and width for the line to be formed from the interconnect metal 550. In one embodiment, the first hard mask 570A comprises any material with a slow etch rate relative to the interconnect metal 550 (e.g., any suitable hard mask material as described above, such as tungsten (W)). In one embodiment, the first hard mask 570A may comprise the same material or material(s) used for the first liner 540A and/or second liner 540B. In such case, the first hard mask 570A may be deposited with a sufficient thickness such that the portion of the second liner 540B beneath the first hard mask 570A is not reached during the etch at stage 500D (described below).

In one example, stage 500C also includes or is preceded by an anneal of the interconnect metal 550 such that the interconnect metal 550 comprises large grains. In one example, stage 500C may also include or be preceded by polishing/planarization (e.g., CMP) to achieve a desired thickness and uniformity of the interconnect metal 550.

At stage 500D, the interconnect metal 550 is patterned to form the basic structure of the line. For example, the patterning of the metal may include patterning and depositing a first hard mask 570A over the interconnect metal 550 and etching the interconnect metal 550 using the first hard mask 570A. In particular, the etch removes material at a faster rate over portions not covered by the first hard mask 570A. In accordance with the present disclosure, the etch at stage 500D may comprise any available etching technique, such as reactive ion etching (RIE), deep reactive ion etching (DRIE) and so forth. For example, The result is shown in FIG. 5D at stage 500D where a significant portion of the interconnect metal 550 has been removed and the first liner 540A has been re-exposed. In one embodiment, the etch is stopped when light scattering of the liner occurs. For example, the first liner 540A may comprise tantalum, which will scatter an identifiable light pattern when the etch penetrates through the interconnect metal 550 and reaches the first liner 540A. In one embodiment, if any of the first hard mask 570A remains after the etch is stopped, then the excess of first hard mask 570A may be removed.

Figure 5E:
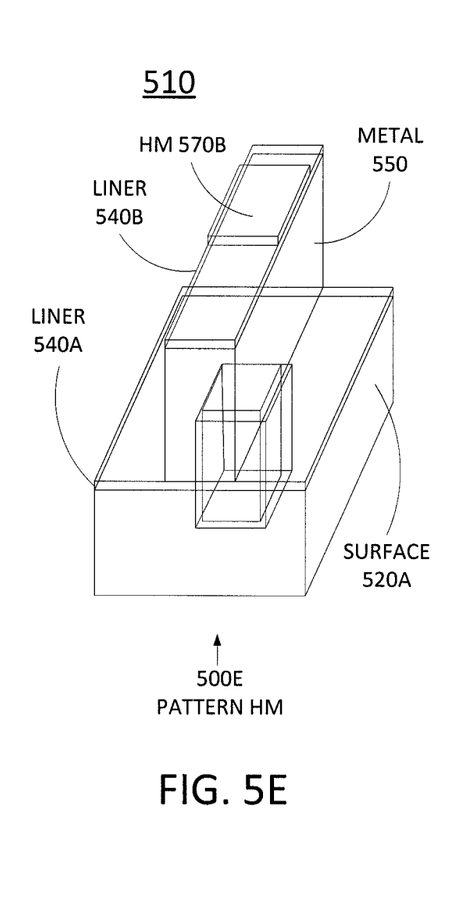

At stage 500E, a second hard mask 570B is formed over a portion of the second liner 540B. For instance, second hard mask 570B may have the same dimensions as the desired cross-sectional dimensions of a second via to be formed from the interconnect metal 550.

Figure 5F:
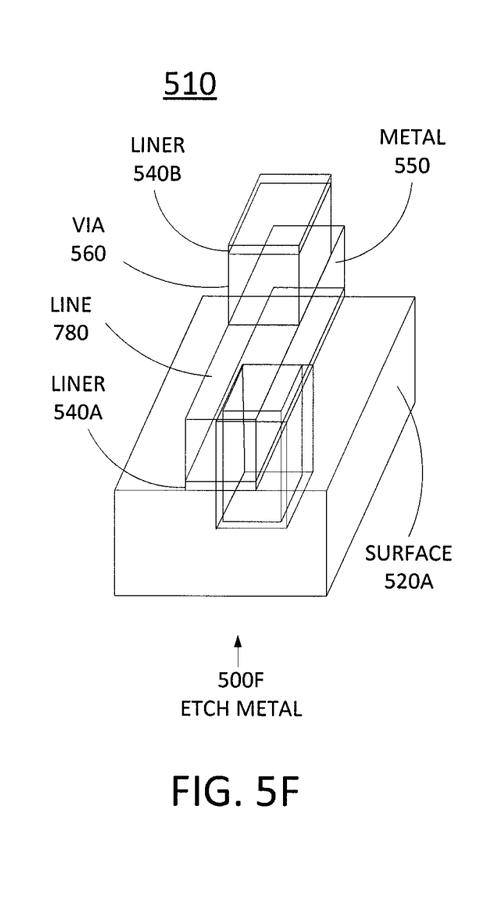

At stage 500F, the interconnect metal 550 is etched, e.g., using reactive ion etching (RIE) or the like. In one example, the etch comprises a timed etch since there is no etch stop layer. Notably, after the etch the essential structure of the via-line-via interconnect is in place. For instance, the first via portion is indicated by numeral 530, the line portion is indicated by the numeral 580 and the second via portion is indicated by the numeral 560. In one example, any remaining portion of the second hard mask 570B may be removed, e.g., by CMP. In the present example, the interconnect metal 550 is first etched at stage 500D to have a 4:1 aspect ratio (excluding the portion of the first via 530). Accordingly, the etch at stage 500F may be applied and halted such that the second via 560 and the line 580 each have a 2:1 aspect ratio.

Figure 5G:
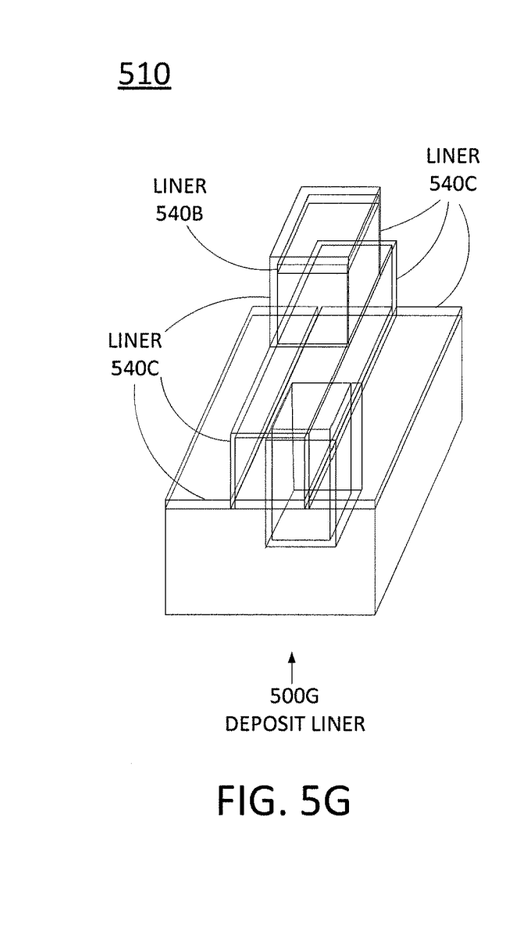

At stage 500G a third liner 540C is deposited over the interconnect structure 510. For example, the third liner 540C may be deposited at a thickness of approximately 2 nanometers. Notably, the thickness of second liner 540B may be increased by 2 nanometers (or other thickness corresponding to the intended the third liner 540) as part of the liner deposition.

Figure 5H:
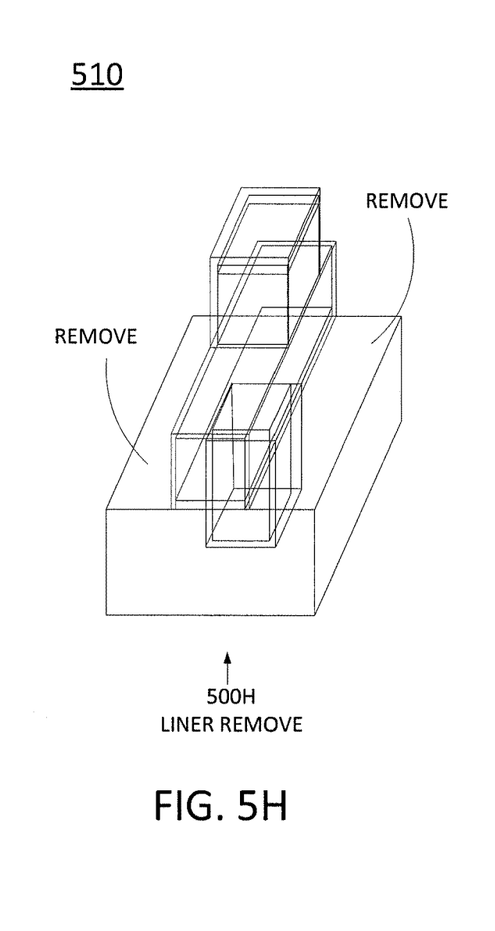

At stage 500H, a portion of the third liner 540C is removed. For example, surfaces that are not to be etched may be masked and the third liner 540C selectively etched in the areas indicated in the figure.

Figure 5I:
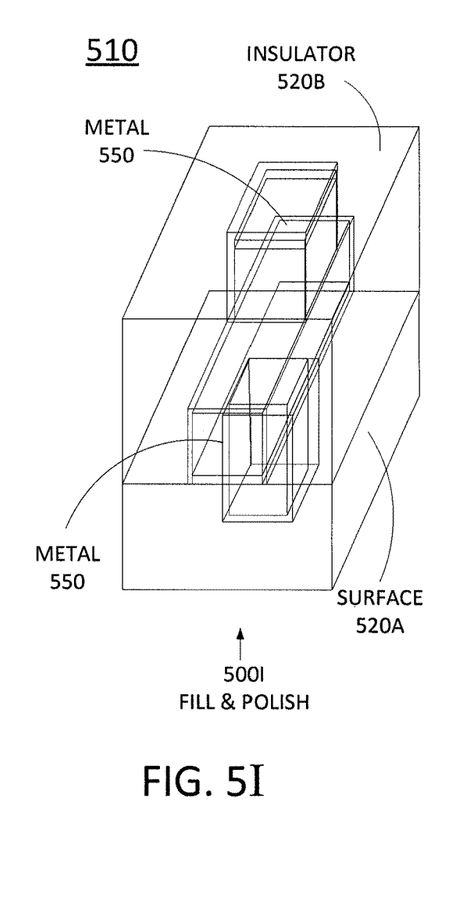

Stage 500I includes filling the interconnect structure 510 with additional insulator 520B (e.g., a material of the same or different composition as that of surface 520A). In one example, the insulator 520B is deposited by at least one of spin-on, physical vapor deposition (PVD) or chemical vapor deposition (CVD). In one example, the insulator 520B includes at least one air gap. In addition, stage 500I may also include polishing and/or chemical mechanical planarization (CMP) to produce a substantially uniform (top) surface of the integrated circuit 510.

Notably, the process of FIGS. 5A-5I results in grain continuity and material continuity between the first via 530 and the line 580 and between the line 580 and the second via 560. In other words, the line 580 and the first via 530 share at least one common grain and the line 580 and the second via 560 also share at least one common grain. The process of FIGS. 5A-5I also provides for large grains through the anneal performed prior to or as part of stage 500C.

Although various embodiments which incorporate the teachings of the present disclosure have been shown and described in detail herein, those skilled in the art can readily devise many other varied embodiments that still incorporate these teachings. It should also be noted that any specific dimensions described herein are provided by way of example only, and not by way of limitation. As such, the present disclosure is not limited to any particular scale, size or configuration, except as specifically recited in the claims.

What is claimed is:
1. An integrated circuit, comprising:
  a surface of the integrated circuit, the surface comprising a semiconductor;
  a via-line-via interconnect formed from a metal and comprising:
    a first via formed in the surface;
    a line formed integrally with the first via and orientated perpendicularly relative to the first via, wherein the line and the first via share at least one common grain, and wherein the line is further formed on the surface and orientated parallel to the surface, wherein a thickness of the line is defined in a dimension perpendicular to the surface, and a line width of the line is defined in a dimension parallel to the surface and is within the range of two nanometers to eighty nanometers, wherein an average grain size of the metal of the line is greater than or equal to at least half of a line width of the line, wherein the line has a tapered cross section, and wherein the thickness of the line remains constant; and
    a second via formed integrally with the line and orientated perpendicular relative to the line, wherein the line and the second via share at least one common grain, and wherein the line is positioned between the first via and the second via and between the surface and the second via,
    such that the via-line-via interconnect exhibits grain continuity and material continuity between the first via and the line and between the line and the second via, where the grain continuity is evident in the line sharing a respective common grain with each of the first via and the second via; and an insulator deposited on the surface and surrounding the interconnect, wherein the insulator is formed from a material that is different from a material from which the surface is formed.

2. The integrated circuit of claim 1, wherein the metal comprises:
copper;
a copper alloy;
aluminum;
an aluminum alloy;
tungsten;
a tungsten alloy;
nickel;
a nickel alloy;
cobalt;
a cobalt alloy;
silver;
a silver alloy;
gold; or
a gold alloy.

3. The integrated circuit of claim 1, further comprising:
a liner deposited over the via-line-via interconnect; and
an insulator formed over the liner, such that the liner separates the insulator from the via-line-via interconnect.

4. The integrated circuit of claim 3, wherein the liner comprises at least one of:
tantalum;
tantalum nitride;
titanium; or
titanium nitride.

5. The integrated circuit of claim 1, further comprising:
at least one dielectric material at least partially surrounding the line and having a k-value in the range of 1.0 to 2.8.

6. The integrated circuit of claim 1, wherein the line is formed by operations comprising:
depositing a layer of the metal onto the surface of the integrated circuit;
annealing the metal;
planarizing the metal; and
patterning the metal that is annealed and planarized.

7. The integrated circuit of claim 6, wherein the planarizing comprises at least one of:
reactive ion etching;
physical sputtering;
chemical mechanical polishing; or
wet etching.

8. The integrated circuit of claim 6, wherein the surface includes a polish stop formed integrally with the surface and wherein the planarizing comprises polishing the metal until the polish stop is reached.

9. The integrated circuit of claim 1, wherein the line width of the line is half the thickness of the line.

10. The integrated circuit of claim 1, wherein the thickness of the line is approximately 40 nanometers.

11. The integrated circuit of claim 1, wherein line width of the line is 20 nanometers or less.

12. The integrated circuit of claim 1, wherein the thickness of the line is two times the line width of the line.

13. The integrated circuit of claim 1, wherein a taper angle from the widest width to the narrowest width is within a range of 70 to 90 degrees.

14. The integrated circuit of claim 1, wherein the surface is a substrate upon which the integrated circuit is fabricated.

15. The integrated circuit of claim 1, wherein the surface is a die upon which the integrated circuit is fabricated.

16. The integrated circuit of claim 1, wherein the surface is flat.

* * * * *